(12) United States Patent
Langa et al.

(10) Patent No.: US 9,620,375 B2
(45) Date of Patent: Apr. 11, 2017

(54) PRODUCTION METHOD

(71) Applicant: Fraunhofer-Gesellschaft zur Foerderung der angewandten Forschung e.V., Munich (DE)

(72) Inventors: Sergiu Langa, Dresden (DE); Christian Drabe, Dresden (DE); Thilo Sandner, Dresden (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 74 days.

(21) Appl. No.: 14/669,072

(22) Filed: Mar. 26, 2015

(65) Prior Publication Data
US 2015/0200105 A1    Jul. 16, 2015

Related U.S. Application Data

(63) Continuation of application No. PCT/EP2013/070246, filed on Sep. 27, 2013.

(30) Foreign Application Priority Data

Sep. 28, 2012   (DE) .................. 10 2012 217 793

(51) Int. Cl.
*H01L 21/311*   (2006.01)
*H01L 21/3065*   (2006.01)
(Continued)

(52) U.S. Cl.
CPC ...... *H01L 21/3065* (2013.01); *B81C 1/00317* (2013.01); *G02B 26/0833* (2013.01)

(58) Field of Classification Search
CPC ............ H01L 21/3065; G02B 26/0833; B81C 1/00317
(Continued)

(56) References Cited

U.S. PATENT DOCUMENTS 4,307,507 A   12/1981   Gray et al.
6,146,917 A   11/2000   Zhang et al.
(Continued)

FOREIGN PATENT DOCUMENTS

DE   10 2005 010 926 A1   3/2006
DE   10 2006 020 536 A1   12/2006
(Continued)

OTHER PUBLICATIONS

Najafi, K., "Micropackaging Technologies for Integrated Microsystems: Applications to MEMS and MOEMS", Micromachining and Microfabrication Process Technology VIII, Proceedings of SPIE, vol. 4979, 2003, pp. 1-19.
(Continued)

*Primary Examiner* — Xinning Niu
*Assistant Examiner* — Vu A Vu
(74) *Attorney, Agent, or Firm* — Keating & Bennett, LLP

(57) ABSTRACT

A production methods includes providing a substrate including a lattice plane that extends in a non-symmetrical manner and such that it is offset at an angle α from at least a first or second main surface region of the substrate, the first and second main surface regions extending parallel to each other; anisotropic etching, starting from the first main surface region, into the substrate so as to obtain an etching structure which includes, in a plane extending perpendicularly to the first main surface region, two different etching angles relative to the first main surface region; arranging a cover layer on the first main surface region, so that the cover layer lies against the etching structure in at least some sections; and removing, section-by-section, the material of the substrate starting from the second main surface region in the area of the deformed cover layer, so that the cover layer is exposed in at least one window region.

15 Claims, 12 Drawing Sheets

(51) Int. Cl.
*B81C 1/00* (2006.01)
*G02B 26/08* (2006.01)

(58) Field of Classification Search
USPC .......................................................... 438/701
See application file for complete search history.

(56) References Cited

U.S. PATENT DOCUMENTS

| | | | |
|---|---|---|---|
| 6,271,150 B1* | 8/2001 | Croswell | H01L 21/02126 257/E21.241 |
| 6,372,981 B1* | 4/2002 | Ueda | C30B 25/02 117/101 |
| 6,787,052 B1 | 9/2004 | Vaganov | |
| 7,534,636 B2* | 5/2009 | Gallup | G02B 6/4277 257/704 |
| 7,776,672 B2* | 8/2010 | Nakazawa | H01L 29/045 438/133 |
| 9,328,010 B2* | 5/2016 | Marenco | C03B 23/02 |
| 2005/0184304 A1 | 8/2005 | Gupta et al. | |
| 2006/0121635 A1 | 6/2006 | Gallup et al. | |
| 2006/0176539 A1 | 8/2006 | Choi et al. | |
| 2007/0024549 A1 | 2/2007 | Choi et al. | |
| 2008/0280124 A1 | 11/2008 | Eklund et al. | |
| 2010/0014147 A1* | 1/2010 | Pinter | B81B 7/0067 359/290 |
| 2010/0226406 A1 | 9/2010 | Wang | |
| 2010/0330332 A1 | 12/2010 | Quenzer et al. | |

FOREIGN PATENT DOCUMENTS

| | | |
|---|---|---|
| DE | 10 2008 012 384 A1 | 9/2009 |
| WO | 03/058330 A1 | 7/2003 |
| WO | 2004/068665 A2 | 8/2004 |
| WO | 2007/069165 A2 | 6/2007 |
| WO | 2009/112138 A2 | 9/2009 |

OTHER PUBLICATIONS

Schenk, H., "The High Versatility of Silicon Based Micro-Optical Modulators", MOEMS and Miniaturized Systems VIII, Proceedings of SPIE, vol. 7208, 2009, pp. 720802-1-720802-12.

Riley, G., "Wafer-level Hermetic Cavity Packaging", Advanced Packaging Magazine, 2004, 8 pages.

Hofmann, U. et al., "Wafer-level Vacuum Packaged Micro-scanning Mirrors for Compact Laser Projection Displays", MOEMS and Miniaturized Systems VII, Proceedings of SPIE, vol. 6887, 2008, pp. 688706-1-688706-15.

Schmidt, M., "Wafer-to-Wafer Bonding for Microstructure Formation", Proceedings of the IEEE, vol. 86, No. 8, Aug. 1998, pp. 1575-1585.

Dragoi, V., "Wafer Bonding: Key Enabling Technology for Photonic Integration", http://www.ieee.org/organizations/pubs/newsletters/les/dec09/RH-Wafer_Bonding.html, 2009, 6 pages.

Eklund, E., "Glass Blowing on a Wafer Level", Journal of Microelectromechanical Systems, vol. 16, No. 2, Apr. 2007, 10 pages.

English translation of Official Communication issued in corresponding International Application PCT/EP2013/070246, mailed on Dec. 11, 2013.

* cited by examiner

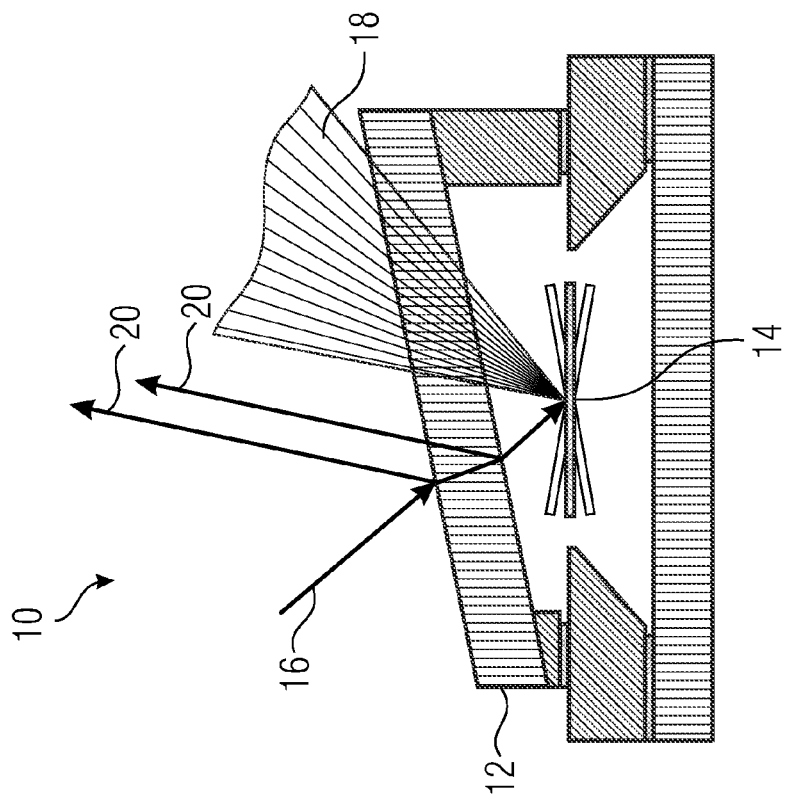
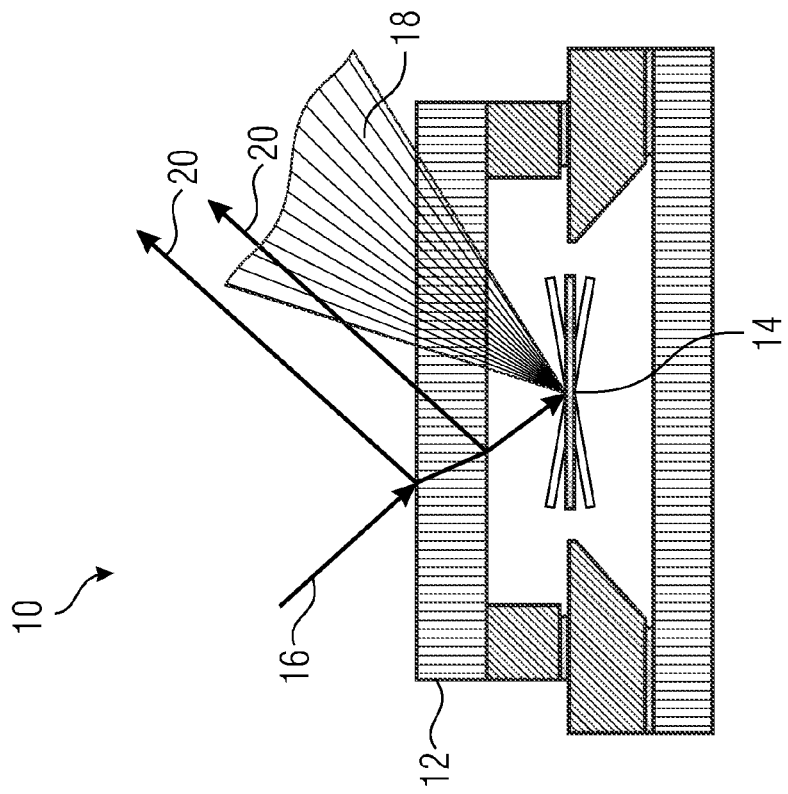
FIG 1A
FIG 1B

PRODUCTION METHOD

CROSS-REFERENCE TO RELATED APPLICATIONS

This application is a continuation of copending International Application No. PCT/EP2013/070246, filed Sep. 27, 2013, which is incorporated herein by reference in its entirety, and additionally claims priority from German Application No. 10 2012 217 793.0, filed Sep. 28, 2012, which is also incorporated herein by reference in its entirety.

BACKGROUND OF THE INVENTION

Embodiments of the present invention relate to a production method. Further embodiments of the present invention relate to a method of producing tilted glass windows for wafer level encapsulation of microsystems. Further embodiments of the present invention relate to a method of producing a package for encapsulating a microscanner mirror.

There are many reasons why microsystem chips may be packaged. The most evident one is to protect the microsystem chips against the environment. [K. Najafi, "Micropackaging Technologies for Integrated Microsystems: Applications to MEMS and MOEMS", Micromachining and Microproduction Process Technology VIII, Proceedings of SPIE 4979, 0 (2003)]. "Protection", however, here does not necessarily means "total isolation" of the microsystem chip from the surroundings. Normally, microsystem chips communicate with the environment by means of electrical, optical or acoustic signals. When a microsystem chip involves optical communication with the environment, the most intuitive solution is to integrate a window transparent to the wavelength range that may be used for said optical communication into the package of the microsystem chip, as is shown in FIG. 1a.

FIG. 1a shows a schematic view of a package 10 comprising a window 12 for encapsulating an MSD chip having a microscanner mirror 14 (MSD=microscanner devices). An incident light beam 16 impinges upon the surface of the microscanner mirror 14 and is reflected, as a reflected light beam 18, into a predefined region as a function of the deflection of the microscanner mirror 14. However, on the top side and bottom side of the window 12, parasitic reflections 20 of the incident light beam 16 arise which are reflected into the same region as the light beam 18 reflected by the microscanner mirror 14, which impairs the quality of the image generated by the microscanner mirror 14.

Such MSD chips are known, for example, from [H. Schenk, "The high versatility of silicon based micro-optical modulators", MOEMS and Miniaturized Systems VII, ed. D. L. Dickensheets, H. Schenk, Proc. of SPIE 7208, 720802 (2009)].

A further problem may be the Fabry-Perot effect in MOEMS mirrors vibrating in parallel with the cap, as are applied in FTIR systems, for example. Here, too, this disturbing effect may be reduced or eliminated by tilting the window.

It is no trivial task to integrate a window 12 into the package 10 of a microsystem chip. It is even more demanding to hermetically seal the package [G. A. Riley, "Wafer-level Hermetic Cavity Packaging", Advanced Packaging Magazine 13(5), 21 (2004)] and to arrange the window 12 such that it is tilted relative to the microscanner mirror 14, as is shown in FIG. 1 b.

In addition, MSD chips entail vacuum-encapsulation so as to minimize, on the one hand, the energy consumption of the oscillating microscanner mirror and to increase, on the other hand, the resolution of the projection system [Hofmann et. al., "Wafer-level vacuum packaged micro-scanning mirrors for compact laser projection displays", MOEMS and Miniaturized Systems VII, ed. D. L. Dickensheets, H. Schenk, Proc. of SPIE 6887, 688706 (2008)]. In addition, a tilted window 12 may be used for avoiding image distortions due to parasitic reflections 20 at the surfaces of the window 12. The parasitic reflections are caused by the difference in the refractive index between the material of the window 12 (e.g. glass) and the air. In a window 12 that is parallel to the device (e.g. the microscanner mirror), the parasitic reflections are reflected into the same region as the projected light, or image, 18, as is shown in FIG. 1a. This results in a parasitic dot or spot which permanently disturbs or impairs the projected image 18, which is unacceptable in particular for high-quality projection systems.

There are various approaches to liberating the projected image 18 from the parasitic reflections 20. For example, a Bragg reflector may be used which is deposited onto the surface (e.g. top side) of the window 12 in the form of a suitable layer stack. However, in this manner, only a small wavelength range may be suppressed, which is why this solution is not suitable for projecting colored images.

As was already mentioned above, another possibility is to tilt the window 12 at a suitable angle in relation to the device. As is shown in FIG. 1 b, the parasitic reflections 20 are thus no longer located within the projection range, which means that the projected image is no longer disturbed. The same effect can be achieved when instead of the window 12, the device is tilted relative to the window 12. Both cases in practice result in the problem of implementation, in particular when considering that the package should be vacuum-tight and low in cost.

An efficient possibility of realizing a low-cost vacuum package is WLP (wafer level packaging), as is shown in FIG. 2. It involves simultaneously packaging the chips on an, e.g., 6 or 8 inch wafer by means of a bonding method between a device wafer 22, which comprises the microsystem chips, and one or more cap wafer(s) 12 and 24 [M A. Schmidt, "Wafer-to-Wafer Bonding for Microstructure Formation", Proceedings of the IEEE 86(8), 1575 (1998)] [V. Dragoi, "Wafer Bonding: Key Enabling Technology for Photonic Integration", http://www.ieee.org/organizations/pubs/newsletters/leos/dec09/RH-Wafer Bonding.html (2009)]. Of course, one of the cap wafers 12 or 24, e.g. the upper cap wafer 12, should comprise an array of tilted windows 12 for packaging MSD chips.

In order to practically implement the structure shown in FIG. 2, the features mentioned in the following may be used. A device wafer comprising the MSD chips 22, a top cap wafer comprising the tilted windows 12, a bottom cap wafer, e.g. a raw silicon wafer 24, and a suitable bonding method for bonding the wafers 26. FIG. 2 shows an example of a vacuum-packaged chip with a window (e.g. made of glass) for interaction with the environment.

For bonding glass and silicon, or silicon and silicon, there are several well-established methods such as anodic bonding, eutectic bonding, and direct bonding, for example. The main problem in producing the structure shown in FIG. 2 therefore is not constituted by bonding the wafers, but by producing a top-cap wafer that is high-quality in terms of optics, is mechanically stable and comprises an array of tilted windows 12.

The challenges in producing top-cap wafers with tilted windows may thus be summarized as follows. Firstly, the tilted windows 12 are produced at the wafer level (e.g. on a 6 or 8 inch wafer) in order to be able to use the WLP approach. Secondly, glass cannot be easily structured at the wafer level by means of standard techniques such as wet etching, dry etching, laser etching, or laser structuring. Thirdly, the glass wafers have a high optical quality following structuring, e.g. the roughness of the structured windows, i.e. the peak-to-valley distance, should be smaller than $\lambda/10$ so as to allow the device to communicate with the environment without any disturbance or distortion. Fourthly, since glass is very brittle or fragile and since bonding involves applying pressure between the bonding partners, the finally structured wafer with the tilted windows should not crack during the bonding process. In fifth place, the glass used should have a linear coefficient of thermal expansion that is comparable with silicon so as to avoid cracking of the glass during the bonding process. Suitable glasses are Pyrex® or Borofloat®.

Typical wafer level microproduction technologies for silicon are photolithography and etching. As etching techniques, wet etching and dry etching are normally used. As compared to silicon, glass comprises no crystallographic features, so that structuring by means of wet etching, for example by means of buffered hydrofluoric acid (HF), results in microstructures having curved side walls and low aspect ratios. Dry etching, e.g. deep reactive ion etching, can be used to obtain microstructures having straight side walls; however, the depth of the microstructures is limited by the slow etch rate.

Another structuring technology used for structuring glass is laser structuring. However, due to poor thermal properties of most glasses, this structuring method may lead to cracks in the glasses or to other problems such as poor surface qualities of the glasses, for example. In addition, laser structuring cannot be used for large-area structuring of, e.g., 6 or 8 inch wafers.

Due to the limitations of the above-mentioned structuring technique, classical glass molding or glass blowing currently seems to be the most effective technique for structuring glass.

There are several documents, such as WO 2004/068665, U.S. Pat. No. 6,146,917, and US 2005/0184304, for example, which describe methods of producing optical windows for wafer level packaging of microsystem chips. However, in the cases mentioned, the windows are parallel to the device wafers. Consequently, said production methods are not applicable to the above-described MSD chip.

Methods for producing arrays of tilted or shaped windows are described in WO 2009/112138 A2, US 2008/0280124 A1, WO 2007/069165, US 2006/0176539 A1, and US 2007/0024549 A1.

For example, in WO 2009/112138 A2, a glass structuring process for wafer level packaging is described, where a glass wafer comprising so-called dummy support elements is bonded to a silicon wafer comprising cavities. During an annealing step at a temperature of more than 820° C., the glass softens, and the dummy support elements are pressed into the cavities in a controlled manner and thus form the glass as desired.

US 2008/0280124 A1 describes a glass blowing process at the wafer level [E. J Eklund and A. M. Shkel, "Glass Blowing on a Wafer Level", J. of Microelectromechanical Systems 16(2), 232 (2007)]. The process is based on wafer bonding of a glass wafer and a structured silicon wafer under atmospheric pressure. The structured silicon wafer contains an array of cylindrical cavities comprising an increased volume in the bulk of the substrate, so that during the bonding process, a significant amount of gas can be stored inside the cavities. Subsequently, the bonded structure is subjected to an annealing step at a temperature of more than 820° C. During the annealing step, the gas stored within the silicon cavities will expand, the annealing temperature being above the softening point of the glass used, so that an array of spherical glass cavities will form. Said array of spherical glass cavities at the wafer level can be used be used for wafer level packaging of MSD chips so as to eliminate the parasitic reflections from the projection field. However, due to the mechanical forces applied during the bonding process or WLP process, the spherical cavities may be destroyed since in this case there is no more planar surface for applying force during bonding.

SUMMARY

According to an embodiment, a production method may have the steps of: providing a semiconductor substrate including a (100) lattice plane that extends in a non-symmetrical manner and such that it is offset at an angle $\alpha$ from at least a first main surface region or a second main surface region of the semiconductor substrate, the first main surface region and the second main surface region extending parallel to each other; starting from the first main surface region, section-by-section anisotropic etching into the semiconductor substrate so as to achieve an etching structure which includes, in a plane extending perpendicularly to the first main surface region of the semiconductor substrate, two different etching angles relative to the first main surface region; arranging a cover layer on the first main surface region of the semiconductor substrate, so that the cover layer is deformed to lie against the etching structure in at least some sections; and removing, section-by-section, the material of the semiconductor substrate starting from the second main surface region in the area of the deformed cover layer, so that in the semiconductor substrate a window region is formed wherein the cover layer is arranged in a manner that is non-parallel to the first main surface region and wherein the cover layer is exposed.

According to another embodiment, a production method may have the steps of:

providing a semiconductor substrate including a (100) lattice plane that extends in a non-symmetrical manner and such that it is offset at an angle $\alpha$ from at least a first main surface region or a second main surface region of the semiconductor substrate, the first main surface region and the second main surface region extending parallel to each other; starting from the first main surface region, section-by-section anisotropic etching into the semiconductor substrate so as to achieve an etching structure which includes, in a plane extending perpendicularly to the first main surface region of the semiconductor substrate, two different etching angles relative to the first main surface region; arranging a cover layer on the first main surface region of the semiconductor substrate, so that the cover layer is deformed to lie against the etching structure in at least some sections; and removing, section-by-section, the material of the semiconductor substrate starting from the second main surface region in the area of the deformed cover layer, so that in the semiconductor substrate a window region is formed wherein the cover layer is arranged in a manner that is non-parallel to the first main surface region and wherein the cover layer is exposed.

In embodiments, a semiconductor substrate is provided, the lattice structure of which is arranged such that a lattice plane of the lattice structure, e.g. the (100) lattice plane, is arranged in a non-symmetrical manner and such that it is offset at an angle α from at least a first main surface region or a second main surface region of the semiconductor substrate, and as a result, for example, the 111 plane that is relevant to an anisotropic "etch stop" is also asymmetrically tilted. By means of the semiconductor substrate with the lattice plane that is arranged in an offset or tilted manner, an etching structure may be provided, by means of anisotropic etching, which comprises, in one plane extending perpendicularly to the first main surface region of the semiconductor substrate, two different etching angles relative to the first main surface region. Due to the fact that a cover layer is arranged on the first main surface region of the semiconductor substrate such that the cover layer lies against the etching structure in at least some sections, the cover layer, too, comprises, in the area of the etching structure, the two different angles relative to the first main surface region. Following section-by-section removal of the material of the semiconductor substrate starting from the second main surface region in the area of the deformed cover layer, a window region will result wherein the cover layer is arranged in such a manner that it is not parallel to, but offset or tilted relative to the first main surface region.

BRIEF DESCRIPTION OF THE DRAWINGS

Embodiments of the present invention will be explained in more detail with reference to the accompanying drawings, wherein:

FIG. 1a shows a schematic view of a package with a parallel window for encapsulating a microsystem chip;

FIG. 1b shows a schematic view of a package with a tilted window for encapsulating a microsystem chip;

DETAILED DESCRIPTION OF THE INVENTION

Figure 2:
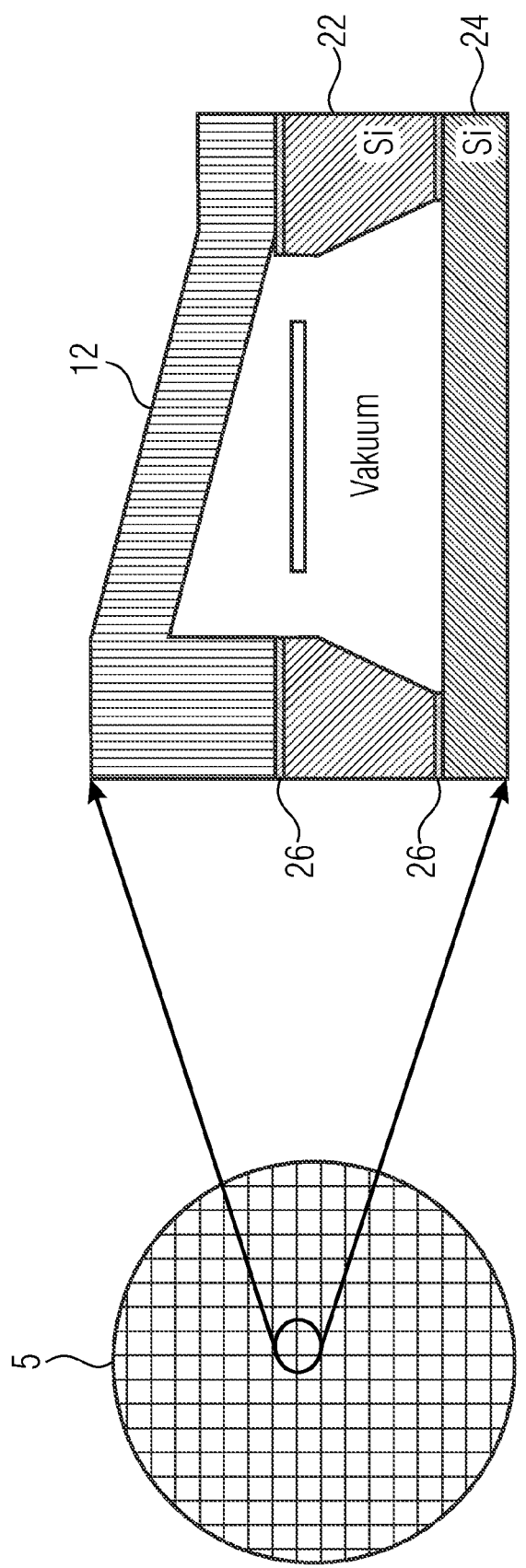
FIG. 2 shows a schematic view of a package with a tilted window for vacuum-encapsulating a microsystem chip at the wafer level.

In the description which follows, elements that are identical or have identical actions are provided with identical reference numerals in the figures, so that their descriptions are mutually exchangeable in the various embodiments.

Moreover, the Miller indices will be used in the following description for designating lattice planes and/or lattice directions of a lattice structure (crystal lattice structure) of a semiconductor substrate. The notation (hkl) designates a specific lattice plane, whereas the notation {hkl} designates any symmetrically equivalent lattice planes. In addition, the notation [uvw] designates a specific lattice direction or a specific lattice vector, whereas the notation in <uvw> designates any symmetrically equivalent lattice vectors.

Figure 3:
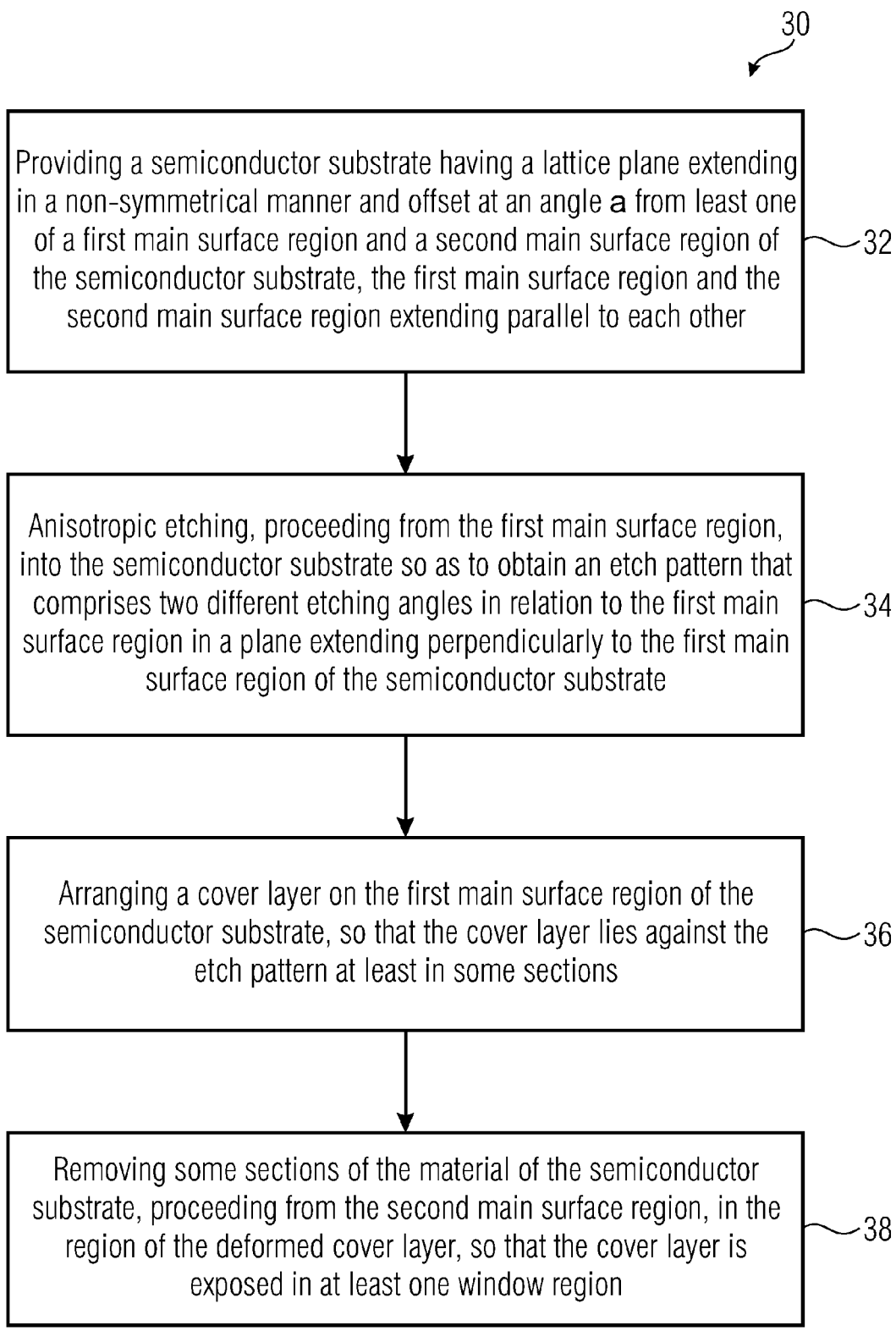
FIG. 3 shows a flowchart of a production method in accordance with an embodiment of the present invention.

FIG. 3 shows a flow chart of a production method 30 in accordance with an embodiment of the present invention. A first step 32 comprises providing a semiconductor substrate comprising a lattice plane that extends in a non-symmetrical manner and such that it is offset at an angle α from at least a first main surface region or a second main surface region of the semiconductor substrate, the first main surface region and the second main surface region extending parallel to each other. A second step 34 comprises section-by-section anisotropic etching, starting from the first main surface region, into the semiconductor substrate so as to obtain an etching structure which comprises, in a plane extending perpendicularly to the first main surface region of the semiconductor substrate, two different etching angles relative to the first main surface region. A third step 36 comprises arranging a cover layer on the first main surface region of the semiconductor substrate, so that the cover layer lies against the etching structure in at least some sections. A fourth step 38 comprises removing, section-by-section, the material of the semiconductor substrate starting from the second main surface region in the area of the deformed cover layer, so that the cover layer is exposed in at least one window region.

In embodiments, a semiconductor substrate is provided, the lattice structure of which is arranged such that a lattice plane of the lattice structure, e.g. the (100) lattice plane, is arranged in a non-symmetrical manner and such that it is offset at an angle α, e.g. an angle ranging from 1° and 40°, from at least a first main surface region or a second main surface region of the semiconductor substrate. By means of the semiconductor substrate with the lattice plane that is arranged in an offset or tilted manner, an etching structure may be provided, by means of anisotropic etching, which comprises, in one plane extending perpendicularly to the first main surface region of the semiconductor substrate, two different etching angles relative to the first main surface region. Due to the fact that a cover layer is arranged on the first main surface region of the semiconductor substrate such that the cover layer lies against the etching structure in at least some sections, the cover layer, too, comprises two different angles (=etching angles) relative to the first main surface region. Following section-by-section removal of the material of the semiconductor substrate starting from the second main surface region in the area of the deformed cover layer, a window region will result wherein the cover layer is arranged in such a manner that it is not parallel to, but offset or tilted relative to the first main surface region.

In the following, embodiments of the inventive production method 30 will be described in more detail with reference to FIGS. 4a to 4g. FIGS. 4a to 4g show cross-sections of the semiconductor substrate, of the cover layer, and/or of further optional features following the various steps of the inventive production method 30. In embodiments, the expression "cross-section" relates to a sectional plane arranged perpendicularly to the first main surface region or the second main surface region.

Figure 4A:
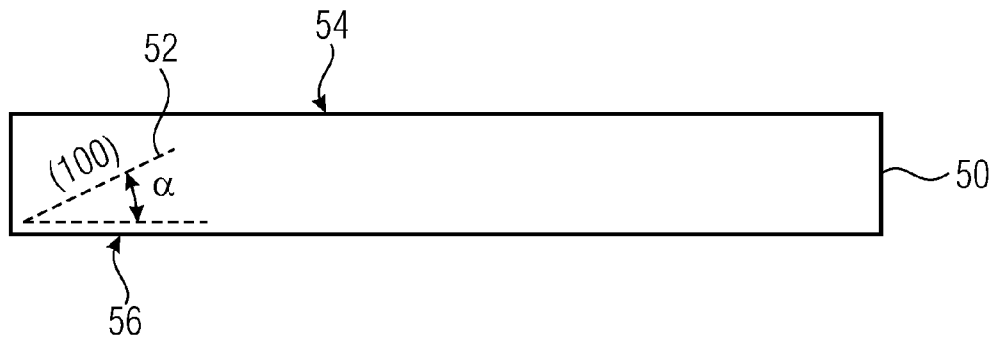
FIG. 4a shows a cross-section of the semiconductor substrate following the step of providing the semiconductor substrate in accordance with an embodiment of the present invention.

FIG. 4a shows a cross-section of the semiconductor substrate 50 following the step 32 of providing the semiconductor substrate 50 in accordance with an embodiment of the present invention. The semiconductor substrate 50 comprises a lattice plane 52 that extends in a non-symmetrical manner and such that it is offset at an angle α from at least a first main surface region 54 or a second main surface region 56 of the semiconductor substrate 50, the first main surface region 54 and the second main surface region 56 extending parallel to each other.

As is shown in FIG. 4a in accordance with an embodiment, in embodiments, the lattice plane of the semiconductor substrate 50 may be the (100) lattice plane. In other words, the semiconductor substrate 50 shown in FIG. 4a comprises an application-specific orientation. This means that the semiconductor substrate 50 comprises no (100) or (111) standard lattice orientation as is customary in conventional microelectronic or microelectromechanical components, but that the semiconductor substrate 50 is arranged such that it is offset or tilted by an angle α relative to the (100) lattice plane. The (100) or (111) lattice plane thus is not, as is customary in conventional microelectronic or microelectromechanical components, arranged in parallel with the first main surface region 54 or the second main surface region 56, but is arranged in a non-symmetrical manner and such that it is offset at an angle α from at least the first main surface region 54 or the second main surface region 56.

The angle α may range from 1° to 40° (or from 10° to 30° or from 18° to 22° or from 15° to 25°).

In embodiments, the step 32 of providing the semiconductor substrate 50 may include a step of cutting out the semiconductor substrate 50 from a semiconductor ingot at the angle α, said semiconductor ingot comprising a (100) standard lattice orientation.

The semiconductor substrate 50 may thus be a semiconductor wafer 50. In this context, the first main surface region 54 may be a "top side" or an area of the "top side" of the semiconductor wafer 50, whereas the second main surface region 56 may be a "bottom side" or an area of the "bottom side" of the semiconductor wafer 50.

In embodiments, the semiconductor substrate 50 may comprise silicon. However, it shall be noted that the present invention is not limited to such embodiments. For example, the semiconductor substrate 50 may also comprise any other semiconductor material such as germanium, gallium phosphide, gallium arsenide, indium phosphide, indium arsenide, gallium nitride, aluminum gallium arsenide, etc., for example.

Figure 4B:
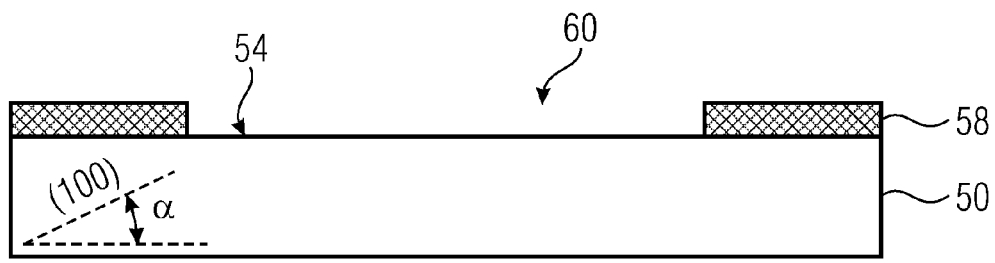
FIG. 4b shows a cross-section of the semiconductor substrate following a step of structured application of a mask onto the first main surface region of the semiconductor substrate in accordance with an embodiment of the present invention.

FIG. 4b shows a cross-section of the semiconductor substrate 50 following a step of structured application of a mask 58 onto the first main surface region 54 of the semiconductor substrate 50 in accordance with an embodiment of the present invention. In this context, the first main surface region 54 may be exposed in an etching region 60, it being possible for edges of the etching region 60 to extend parallel to <110> directions of the lattice structure of the semiconductor substrate 50. Of course, the etching region may also comprise a different geometrical shape. For example, the etching region may be round.

In embodiments, the step of structured application of the mask 58 onto the first main surface region 54 of the semiconductor substrate 50 may comprise a step of vapor depositing or depositing the mask 58 onto the first main surface region 54 of the semiconductor substrate 50 and a step of removing the mask 58 in the etching region 60. Application of the mask 58 may be performed by means of chemical or physical gas-phase deposition or thermal processes. As the mask 58, a dielectric material may be used, for example, while for removing the mask 58 in the etching region 60, a photolithographic method with subsequent dry-chemical or wet-chemical etching may be employed.

The etching region 60 may comprise a rectangular or square structure, it being possible for the etching region 60 to be arranged on the first main surface region 54 in such a manner that edges of the rectangular or square structure of the etching region 60 are parallel to <110> directions of the lattice structure of the semiconductor substrate 50. Of course, the etching region may also comprise a different geometrical shape. For example, the etching region may be round.

For example, the step of applying the mask 58 onto the first main surface region 54 of the semiconductor substrate 50 may include a step of lithographically structuring the custom-oriented semiconductor substrate 50 with the structure of the future window. The structure may be an array of squares or rectangles, it being possible for edges of the squares or rectangles to extend parallel to <110> directions. As was already mentioned, the etching region may also be round. As the mask 58 one may use, for example, an LPCVD SiN layer (LPCVD=low pressure chemical vapor deposition) or a thermal or CVD SiO2 layer.

Figure 4C:
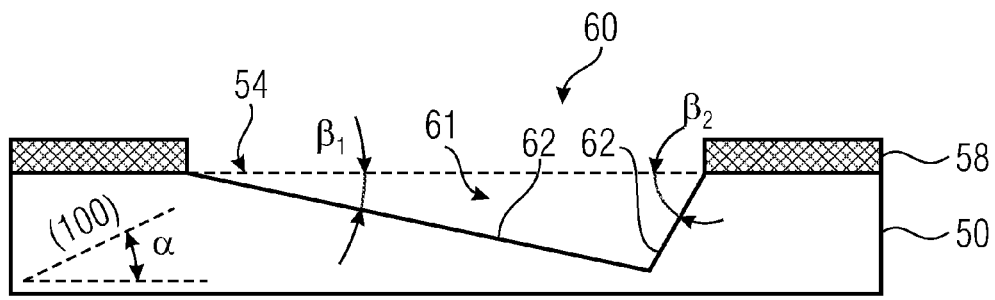
FIG. 4c shows a cross-section of the semiconductor substrate following the step of anisotropic etching, starting from the first main surface region, into the semiconductor substrate in accordance with an embodiment of the present invention.

FIG. 4c shows a cross-section of the semiconductor substrate 50 following the step 34 of anisotropic etching starting from the first main surface region 54 into the semiconductor substrate 50 for obtaining an etching structure 61 in accordance with an embodiment of the present invention. The etching structure 61 may comprise, within a plane extending perpendicularly to the first main surface region 54, two different etching angles $\beta_1$ and $\beta_2$ relative to the first main surface region 54. As is shown in FIG. 4c in accordance with an embodiment, said anisotropic etching may be performed, starting from the first main surface region 54, into the semiconductor substrate 50 in the etching region 60.

In embodiments, the two etching angles $\beta_1$ and $\beta_2$ which differ relative to the first main surface region 54 may be located between the first main surface region 54 and one {111} lattice plane 62, respectively, of the semiconductor substrate. In other words, a first etching angle $\beta_1$ of the two different etching angles $\beta_1$ and $\beta_2$ may be the angle between the first main surface region 54 of the semiconductor substrate 50 and a first {111} lattice plane 62 of the semiconductor substrate 50, whereas the second etching angle $\beta_2$ of the two different etching angles $\beta_1$ and $\beta_2$ may be the angle between the first main surface region 54 of the semiconductor substrate 50 and a second {111} lattice plane 62 of the semiconductor substrate 50, the first {111} lattice plane and the second {111} lattice plane being different {111} lattice planes. In cross-section, the etching structure 61 may thus be defined by two different {111} lattice planes 62 of the semiconductor substrate 50. In other words, the etching structure 61 may be structurally limited in cross-section by two different {111} lattice planes 62 of the semiconductor substrate 50.

Said anisotropic etching may include the step of tetramethyl ammonium hydroxide (TMAH) etching, potassium hydroxide (KOH) etching, or ethylenediamine pyrocatechol (EDP) etching. For example, the structured wafer 50 may be etched in a KOH or TMAH etching solution. Due to the low dissolution rate of the {111} lattice planes, the structure shown in 4c will arise.

Figure 4D:
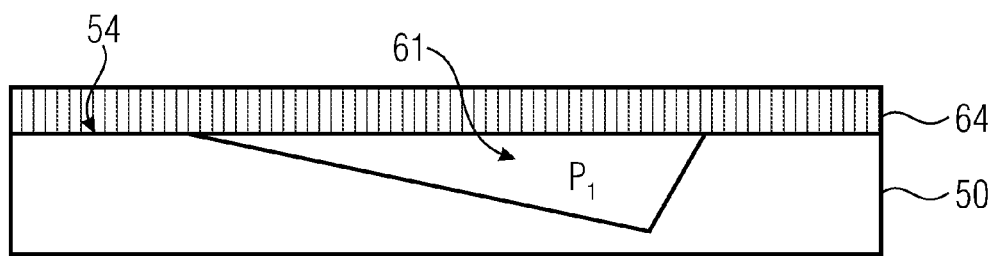
FIG. 4d shows a cross-section of the semiconductor substrate following the step of arranging the cover layer on the first main surface region of the semiconductor substrate in accordance with an embodiment of the present invention.

FIG. 4d shows a cross-section of the semiconductor substrate 50 following the step 36 of arranging the cover layer 64 on the first main surface region 54 of the semiconductor substrate 50 in accordance with an embodiment of the present invention.

As is shown in FIG. 4d in accordance with an embodiment, the step 36 of arranging the cover layer 64 on the first main surface region 54 of the semiconductor substrate 50 may include a step of applying the cover layer 64 onto the first main surface region 54 of the semiconductor substrate 50, so that the cover layer 64 extends across the etching structure 61.

The cover layer 64 may be optically transparent at least in the window region. Optically transparent in this context means that the cover layer 64 is configured to allow electromagnetic waves within a predefined wavelength range to pass through it at least in the window region. The predefined wavelength range may be in the range from, e.g., 380 to 780 nm (visible light spectrum) or in the range from 780 nm to 1 mm (infrared radiation), or within the range from 10 to 380 nm (ultraviolet radiation).

For example, the inventive production method may be used for packaging microscanner mirrors. In this case, the predefined wavelength range may be defined by the wavelength range of a light beam that impinges upon the microscanner mirror and is reflected, e.g., with the aim of avoiding or minimizing attenuation of the impinging and reflected light beam, e.g., attenuation of less than 20%, 15%, 10%, 5%, 3%, 1%, or 0.1%.

In embodiments, the cover layer 64 may comprise glass. For example, the cover layer 64 may be a glass wafer which, in the step of applying the cover layer 64 onto the first main surface region 54 of the semiconductor substrate 50, e.g. a semiconductor wafer 50, is bonded to said semiconductor wafer 50.

The step of applying the cover layer 64 onto the first main surface region 54 of the semiconductor substrate 50 may be performed under a first atmospheric pressure $P_1$, so that the first atmospheric pressure $P_1$ exists between the cover layer 64 and the etching structure. Thus, the cover layer may be applied onto the first main surface region 54 of the semiconductor substrate 50 in such a manner that the first atmospheric pressure $P_1$ is confined between the etching region 61 and the cover layer 64.

The first atmospheric pressure $P_1$ may be a vacuum, for example. In this context, vacuum designates the state of a gas within a volume at a pressure that is clearly lower than the atmospheric pressure under normal conditions, e.g., 1.01325 bar.

For example, the structured wafer 50 may be vacuum-bonded with a glass wafer 64, e.g., Pyrex® or Borofloat®. As the bonding method, anodic bonding may be used, it also being possible, of course, to employ other bonding methods.

Figure 4E:
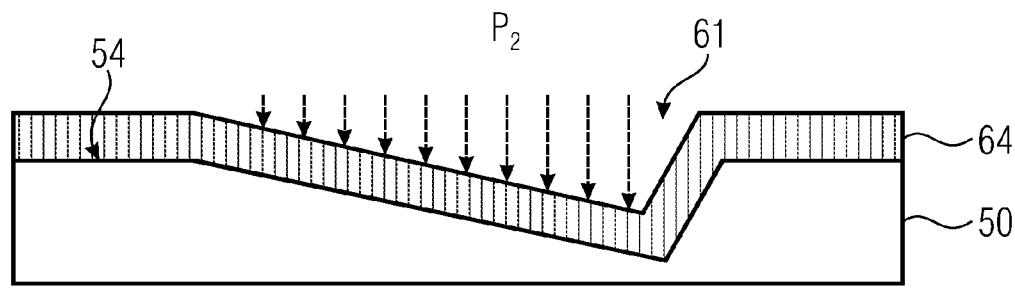
FIG. 4e shows a cross-section of the semiconductor substrate following a step of arranging the cover layer on the first main surface region of the semiconductor substrate, so that the cover layer lies against the etching structure in at least some sections, in accordance with an embodiment of the present invention.

FIG. 4e shows a cross-section of the semiconductor substrate 50 following a step 36 of arranging the cover layer on the first main surface region 54 of the semiconductor substrate 50, so that the cover layer 64 lies against the etching structure 61 in at least some sections, in accordance with an embodiment of the present invention.

The step 36 of arranging the cover layer 64 on the first main surface region 54 of the semiconductor substrate 50 may include a step of deforming the cover layer 64 shown in FIG. 4d in the area of the etching structure 61, so that the cover layer 64 lies against the etching structure 61 in at least some sections.

In embodiments, deformation of the cover layer 64 in the area of the etching structure 61 may be performed under a second atmospheric pressure $P_2$ larger than the first atmospheric pressure $P_1$, and at a temperature higher than a softening point of the cover layer 64, so that the cover layer 64 will deform in the area of the etching structure 61 due to a pressure difference between the first atmospheric pressure $P_1$ and the second atmospheric pressure $P_2$, so that the cover layer 64 lies against the etching structure 61 in at least some sections.

For example, the stack (consisting of silicon wafer and glass wafer, for example) provided following said bonding may be subjected to an annealing step at a temperature higher than the softening point $T_s$ of the glass used (e.g., for Pyrex® and Borofloat®, $T_s$>820° C.). Due to the pressure difference between the vacuum cavity ($P_1$) and the external atmospheric pressure $P_2$, the softened glass is molded into the cavity formed by the {111} lattice planes of the silicon substrate 50.

Figure 4F:
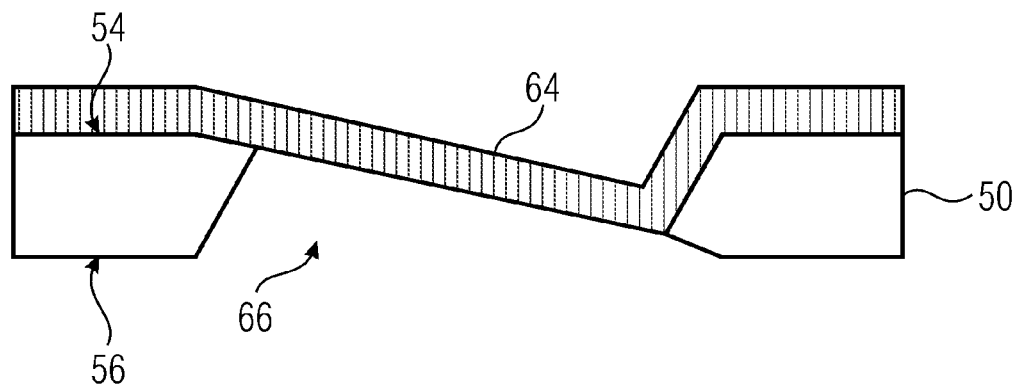
FIG. 4f shows a cross-section of the semiconductor substrate following the step of removing the material of the semiconductor substrate, starting from the second main surface region, in the area of the deformed cover layer in accordance with an embodiment of the present invention.

FIG. 4f shows a cross-section of the semiconductor substrate following the step 38 of removing the material of the semiconductor substrate 50 starting from the second main surface region 56 in the area of the deformed cover layer 64 in accordance with an embodiment of the present invention. As is shown in FIG. 4f, the material of the semiconductor substrate 50 is removed, starting from the second main surface region 56, in the area of the deformed cover layer 64 such that the cover layer 64 is exposed in at least one window region 66.

In other words, in order to render the window 64 transparent to visible light, the silicon 50 is etched starting from the rear side of the tilted window 64.

Figure 4G:
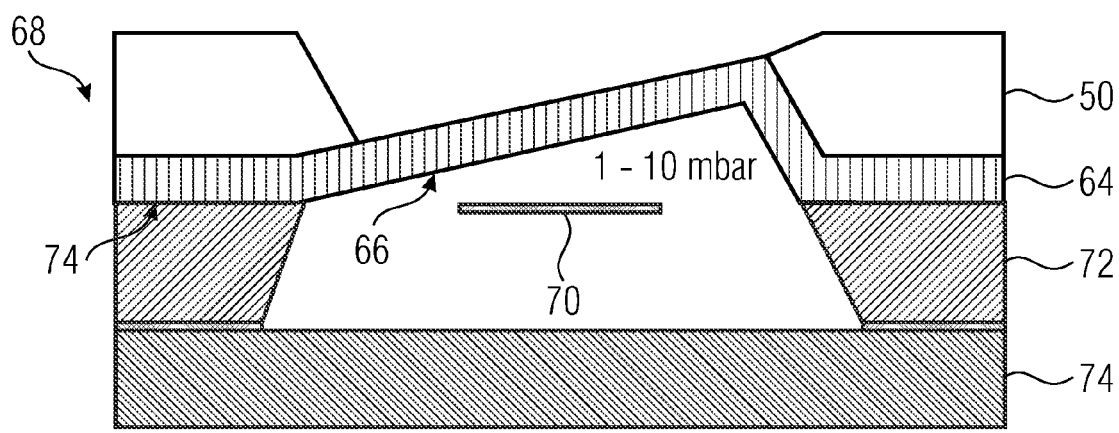
FIG. 4g shows a cross-section of a package for encapsulating a microscanner mirror in accordance with an embodiment of the present invention.

FIG. 4g shows a cross-section of a package 68 for encapsulating a microscanner mirror 70 in accordance with an embodiment of the present invention. For producing the package 70 shown in FIG. 4g, the inventive production method 30 may further include a step of providing a device semiconductor substrate 72 comprising a microscanner mirror 70, which in its idle position is arranged in parallel with a surface 74 of the device semiconductor substrate 72, and a step of bonding the cover layer 64 outside the area of the deformed cover layer 64 (window region) with the surface 74 of the device semiconductor substrate 72, so that the window region 66 is arranged adjacently to the microscanner mirror 70.

In embodiments, the production method 30 may further include the steps of providing a further semiconductor substrate 74 and bonding the further semiconductor substrate 74 with the device semiconductor substrate 72, so that the semiconductor substrate 50, the device semiconductor substrate 72, and the further semiconductor substrate 74 form a package 68 for encapsulating, e.g., vacuum-encapsulating (at a pressure between 1 and 10 mbar), the microscanner mirror 70.

In other words, in FIG. 4g, the embedded tilted window 64 may ultimately be bonded with a device wafer 72 so as to obtain the target structure shown in FIG. 2.

An advantage of the inventive production method 30 consists in that the wafer or the structure shown in FIG. 4f does not entirely consist of glass but comprises a plurality of tilted windows embedded in silicon. The advantage of this is that the wafer may be handled in a simple manner and that the risk of breakage during the bonding process is reduced or minimized. In addition, the silicon frame offers further possibilities of bonding the structure with the device wafer, e.g., Si—Si bonding, in particular in that there exist parallel surfaces for bonding and for applying force.

Figure 5A:
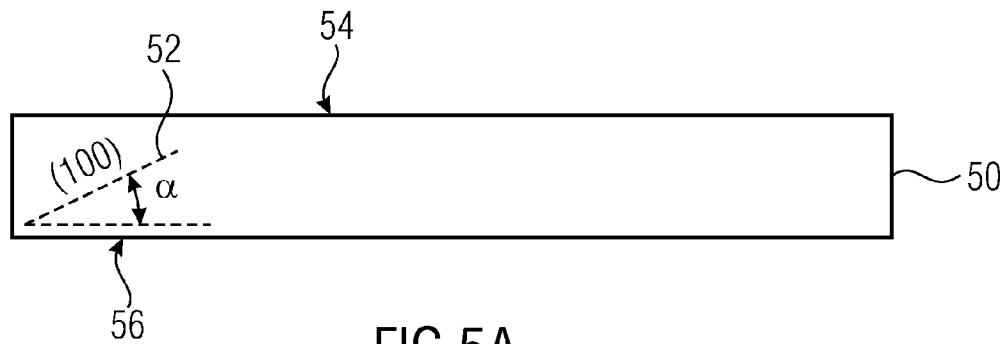
FIG. 5a shows a cross-section of the semiconductor substrate following the step of providing the semiconductor substrate in accordance with an embodiment of the present invention.
Figure 5B:
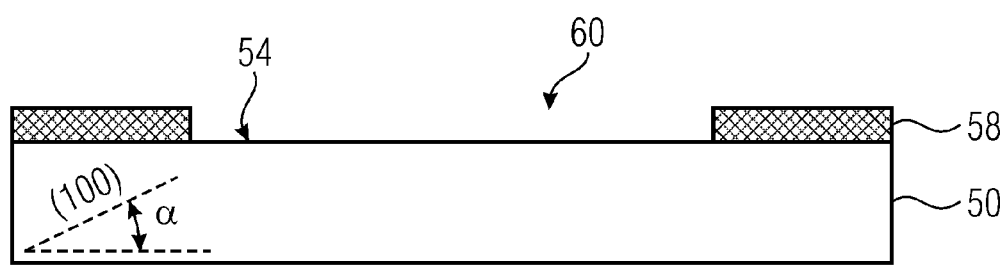
FIG. 5b shows a cross-section of the semiconductor substrate following a step of structured application of a mask onto the first main surface region of the semiconductor substrate in accordance with an embodiment of the present invention.

In the following, further embodiments of the inventive production method 30 will be explained in more detail with reference to FIGS. 5a to 5g. FIGS. 5a and 5b as well as 5f and 5g here correspond to FIGS. 4a and 4b as well as 4f and 4g, so that only differences between FIGS. 5c to 5e and FIGS. 4c to 4e will be described below.

Figure 5C:
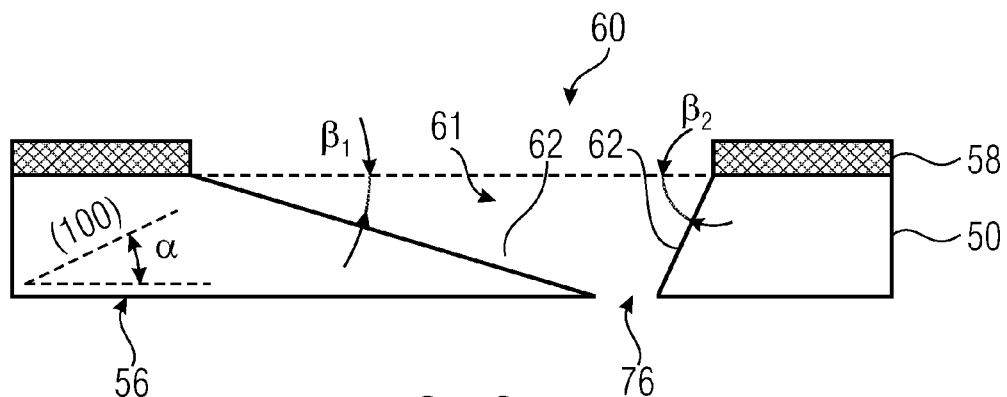
FIG. 5c shows a cross-section of the semiconductor substrate following the step of anisotropic etching, starting from the first main surface region, into the semiconductor substrate in accordance with an embodiment of the present invention.

FIG. 5c shows a cross-section of the semiconductor substrate 50 following the step 34 of anisotropic etching starting from the first main surface region into the semiconductor substrate 50 for obtaining an etching structure 61 in accordance with an embodiment of the present invention. The etching structure 61 may comprise, within a plane extending perpendicularly to the first main surface region, two different etching angles $β_1$ and $β_2$ relative to the first main surface region 54. As is shown in FIG. 5c in accordance with an embodiment, said anisotropic etching may be performed, starting from the first main surface region 54, into the semiconductor substrate 50 in the etching region 60.

In embodiments, said anisotropic etching may be performed starting from the first main surface region 54 into the semiconductor substrate 50 to the second main surface region 56, so that the etching structure 61 will extend from the first main surface region 54 to the second main surface region 56. As is shown in FIG. 5c, a hole 76 may form within the second main surface region 56 in the process.

In other words, the KOH etching shown in FIG. 4c may be expanded, so that a hole 76 is opened at the rear side 56 of the wafer 50.

Figure 5D:
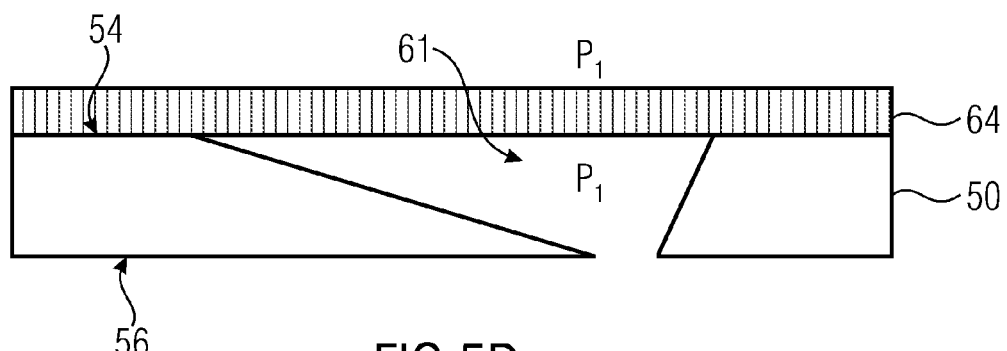
FIG. 5d shows a cross-section of the semiconductor substrate following the step of arranging the cover layer on the first main surface region of the semiconductor substrate in accordance with an embodiment of the present invention.

FIG. 5d shows a cross-section of the semiconductor substrate 50 following the step 36 of arranging the cover layer 64 on the first main surface region 54 of the semiconductor substrate 50 in accordance with an embodiment of the present invention.

As is shown in FIG. 5d in accordance with an embodiment, the step 36 of arranging the cover layer 64 on the first main surface region 54 of the semiconductor substrate 50 may include a step of applying the cover layer 64 onto the first main surface region 54 of the semiconductor substrate 50, so that the cover layer 64 extends across the etching structure 61.

In contrast to FIG. 4c, the step of applying the cover layer 64 onto the first main surface region 54 of the semiconductor substrate 50 may be performed under (almost) any first atmospheric pressure $P_1$, e.g., an atmospheric pressure under normal conditions, such as a pressure of 1.01325 bar, for example. In other words, the wafer bonding in FIG. 5d need not be performed in vacuum.

Figure 5E:
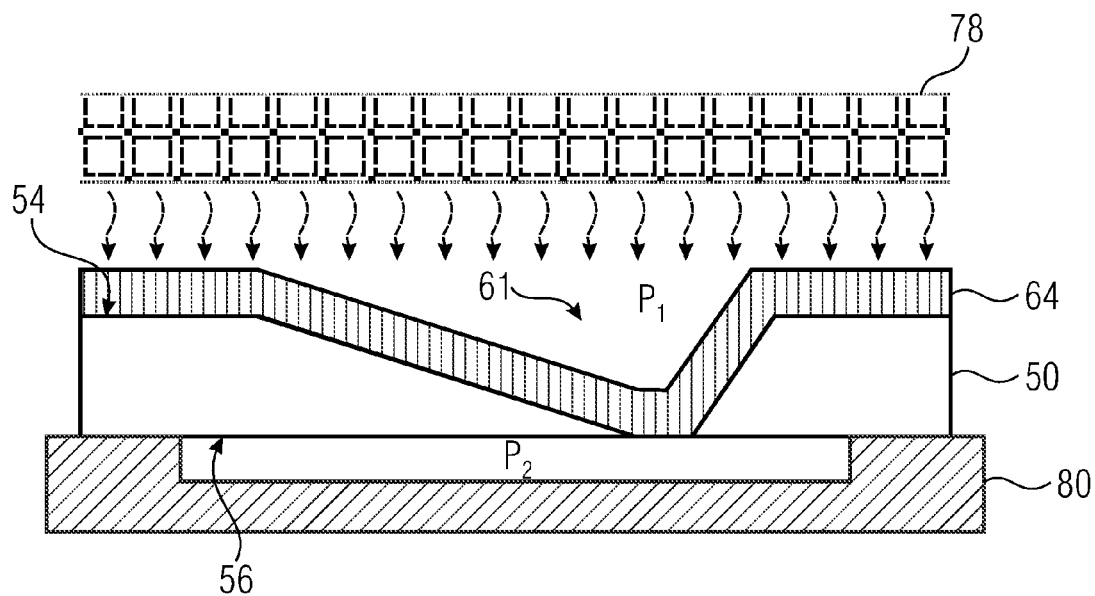
FIG. 5e shows a cross-section of the semiconductor substrate following a step of arranging the cover layer on the first main surface region of the semiconductor substrate, so that the cover layer lies against the etching structure in at least some sections, in accordance with an embodiment of the present invention.
Figure 5F:
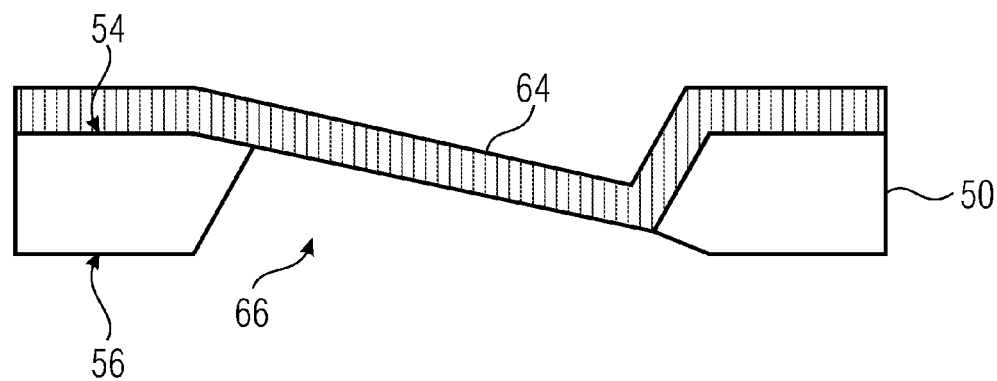
FIG. 5f shows a cross-section of the semiconductor substrate following the step of removing the material of the semiconductor substrate, starting from the second main surface region, in the area of the deformed cover layer in accordance with an embodiment of the present invention.
Figure 5G:
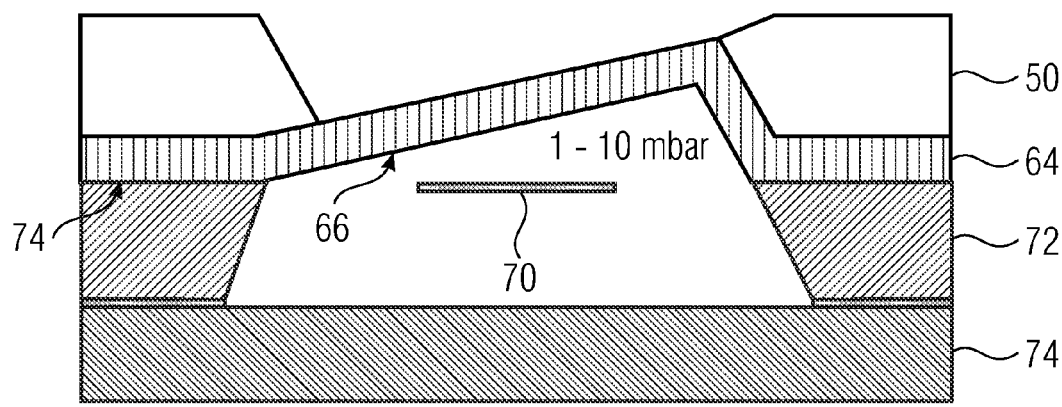
FIG. 5g shows a cross-section of a package for encapsulating a microscanner mirror in accordance with an embodiment of the present invention.

FIG. 5e shows a cross-section of the semiconductor substrate 50 following a step 36 of arranging the cover layer on the first main surface region 54 of the semiconductor substrate 50, so that the cover layer lies against the etching structure 61 in at least some sections, in accordance with an embodiment of the present invention.

The step 36 of arranging the cover layer on the first main surface region 54 of the semiconductor substrate 50 may include a step of deforming the cover layer 64 shown in FIG. 5d in the area of the etching structure 61, so that the cover layer 64 lies against the etching structure 61 in at least some sections.

In embodiments, in the deformation of the cover layer 64 in the area of the etching structure 61, a first atmospheric pressure $P_1$ may be provided adjacently to the cover layer 64, and a second atmospheric pressure $P_2$ larger than the first atmospheric pressure $P_1$ may be provided adjacently to the second main surface region 56, said deformation of the cover layer 64 in the area of the etching structure 61 being performed at a temperature higher than a softening point of the cover layer 64, so that the cover layer 64 will deform in the area of the etching structure 61 due to a pressure difference between the first atmospheric pressure $P_1$ and the second atmospheric pressure $P_2$, so that the cover layer 64 lies against the etching structure 61 in at least some sections.

The second atmospheric pressure $P_2$ may be vacuum, for example. In this context, vacuum designates the state of a gas within a volume at a pressure that is clearly lower than the atmospheric pressure under normal conditions.

For example, the step of deforming the cover layer 64 in the area of the etching structure 61 may be performed within an RTP (rapid thermal processing) chamber with an RTP device 78 and a vacuum chuck 80. During the annealing process at a temperature of more than 820° C., the chuck 80 produces a negative pressure (second atmospheric pressure $P_2$) relative to the atmospheric pressure (first atmospheric pressure $P_1$ within the RTP chamber), so that the same deformation result is achieved as in the vacuum bonding in FIG. 4.

Figure 6A:
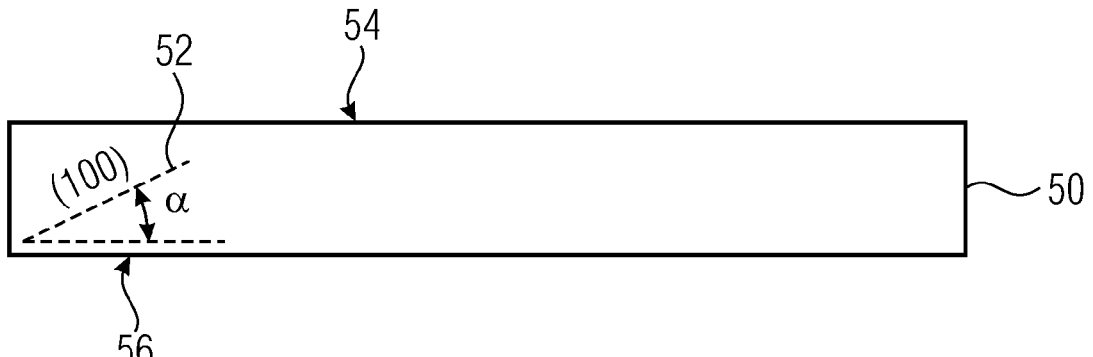
FIG. 6a shows a cross-section of the semiconductor substrate following the step of providing the semiconductor substrate in accordance with an embodiment of the present invention.
Figure 6B:
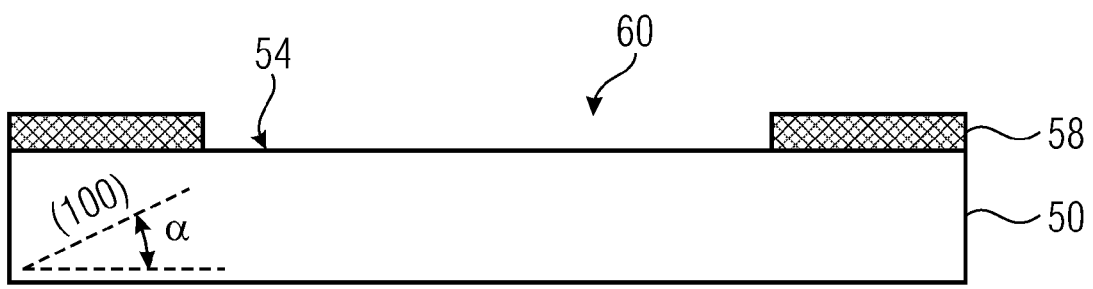
FIG. 6b shows a cross-section of the semiconductor substrate following a step of structured application of a mask onto the first main surface region of the semiconductor substrate in accordance with an embodiment of the present invention.
Figure 6C:
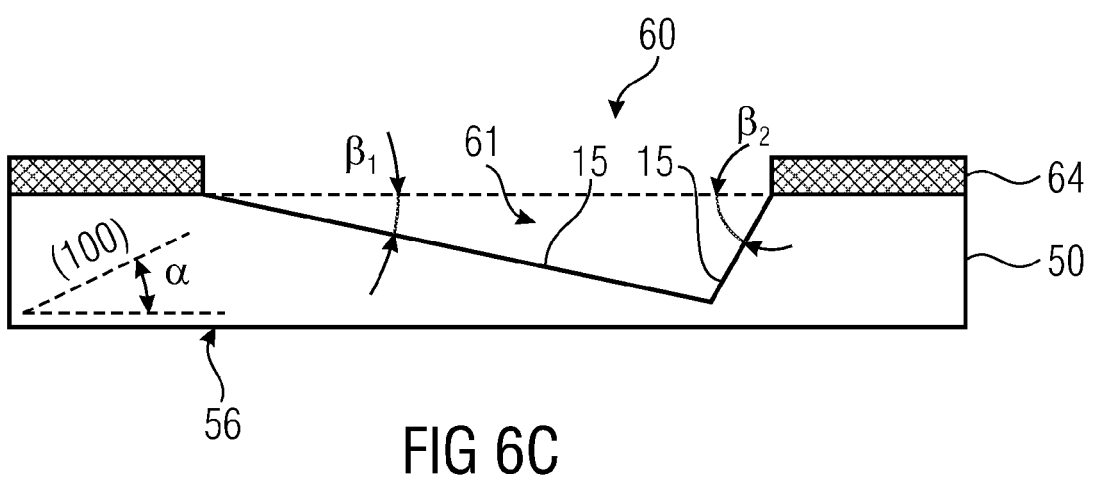
FIG. 6c shows a cross-section of the semiconductor substrate following the step of anisotropic etching, starting from the first main surface region, into the semiconductor substrate in accordance with an embodiment of the present invention.

In the following, further embodiments of the inventive production method 30 will be explained in more detail with reference to FIGS. 6a to 6f. FIGS. 6a to 6c as well as 6e and 6g correspond to FIGS. 4a to 4c as well as FIGS. 4f and 4g, so that only differences between FIG. 6d and FIGS. 4d and 4e will be described below.

Figure 6D:
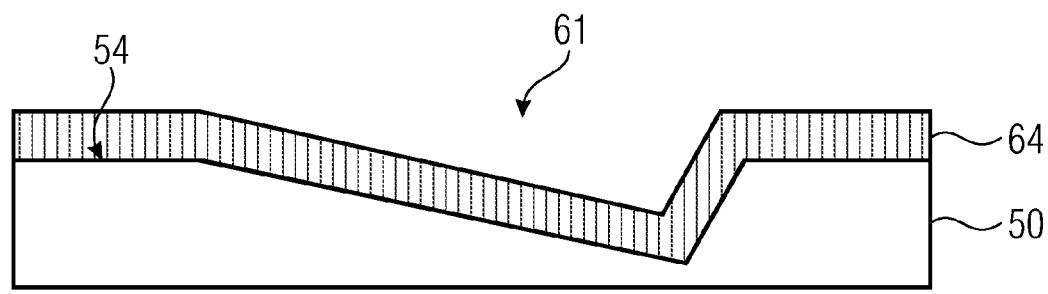
FIG. 6d shows a cross-section of the semiconductor substrate following a step of arranging the cover layer on the first main surface region of the semiconductor substrate, so that the cover layer lies against the etching structure in at least some sections, in accordance with an embodiment of the present invention.
Figure 6E:
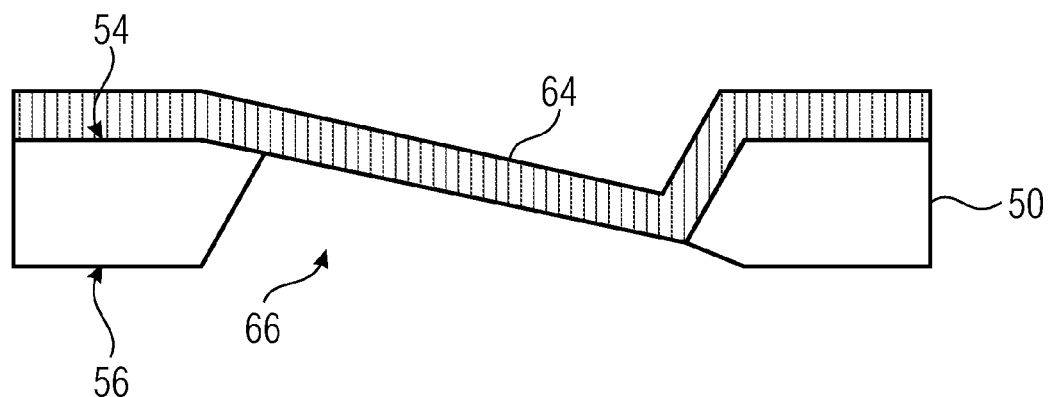
FIG. 6e shows a cross-section of the semiconductor substrate following the step of removing the material of the semiconductor substrate, starting from the second main surface region, in the area of the deformed cover layer in accordance with an embodiment of the present invention.
Figure 6F:
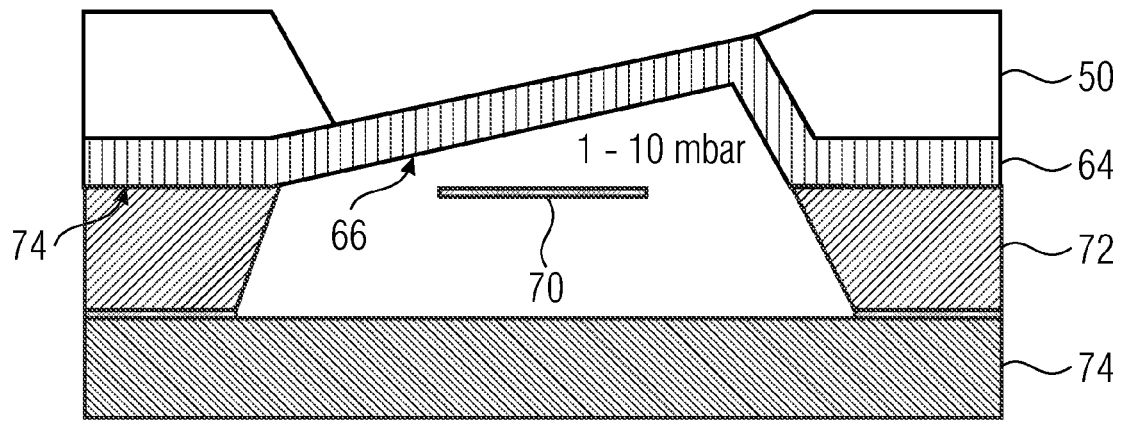
FIG. 6f shows a cross-section of a package for encapsulating a microscanner mirror in accordance with an embodiment of the present invention.

FIG. 6d shows a cross-section of the semiconductor substrate 50 following the step 36 of arranging the cover layer 64 on the first main surface region 54 of the semiconductor substrate 50 in accordance with an embodiment of the present invention.

As is shown in FIG. 6d in accordance with an embodiment, the step 36 of arranging the cover layer 64 on the first main surface region 54 of the semiconductor substrate 50 may include sputter deposition or vapor deposition of the cover layer 64 onto the first main surface region 54 of the semiconductor substrate 50.

In other words, instead of the wafer bonding step, a step of deposition, e.g., sputter deposition or vapor deposition, may be used so as to deposit the glass onto the silicon substrate with the customized orientation.

As was already mentioned, in embodiments the step 32 of providing the semiconductor substrate 50 may include a step of cutting out the semiconductor substrate 50 from a semiconductor ingot at the angle α, the semiconductor ingot comprising a (100) standard lattice orientation. This will be explained in more detail below with reference to FIGS. 7 and 8.

Figure 7:
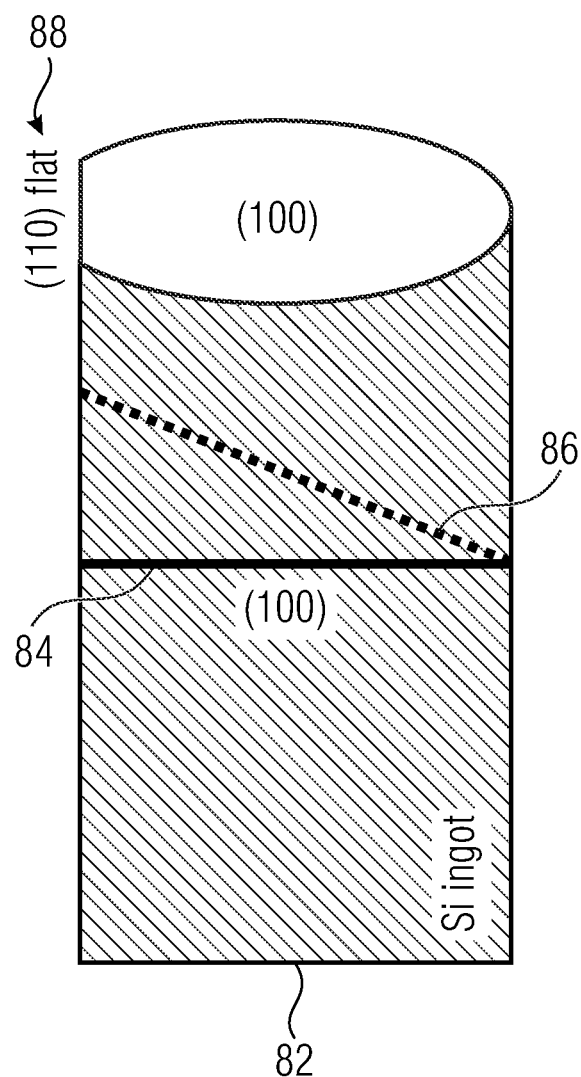
FIG. 7 shows a schematic view of a semiconductor ingot having a (100) standard lattice orientation.

FIG. 7 shows a schematic view of a semiconductor ingot 82 with a (100) standard lattice orientation. In FIG. 7 the (100) lattice plane of the semiconductor ingot 82 is indicated by a first line 84 extending parallel to the "top side" of the semiconductor ingot 82. In addition, in FIG. 7, a second (dashed) line 86 indicates a sectional plane arranged such that it is tilted at the angle α relative to the first line 84. In addition, in FIG. 7 the standard lattice orientation of the semiconductor ingot 82 is characterized by a "lateral" flat 88.

By cutting out the semiconductor substrate 50 from the semiconductor ingot 82 along the second line 86 (off-axis intersection line), a semiconductor substrate 50 may be provided which has a lattice plane that extends in a non-symmetrical manner and such that it is offset at an angle α from at least a first main surface region 54 or a second main surface region 56 of the semiconductor substrate 50.

In other words, the custom-oriented silicon substrate 50 (silicon substrate having an individually adjusted or customized lattice orientation) may be cut out from a semiconductor ingot 82. In contrast to conventional silicon substrates comprising a (100) or (111) standard lattice orientation and being used for microelectronic or microelectromechanical devices, the custom-oriented semiconductor substrate 50 comprises a lattice orientation that is arranged such that it is offset at the angle α relative to the (100) lattice plane. E.g., in a silicon semiconductor substrate 50 where the angle between (100) and the (111) lattice planes is 54.7°, this results in the glass window 64 being arranged such that it is offset at an angle $\beta=\alpha\pm54.7°$ relative to the encapsulated device. However, it shall be noted that the present invention is not limited to such embodiments. As was already mentioned, the semiconductor substrate 50 may also comprise any other semiconductor material such as germanium, gallium phosphide, gallium arsenide, indium phosphide, indium arsenide, gallium nitride, aluminum gallium arsenide, etc., for example.

Figure 8:
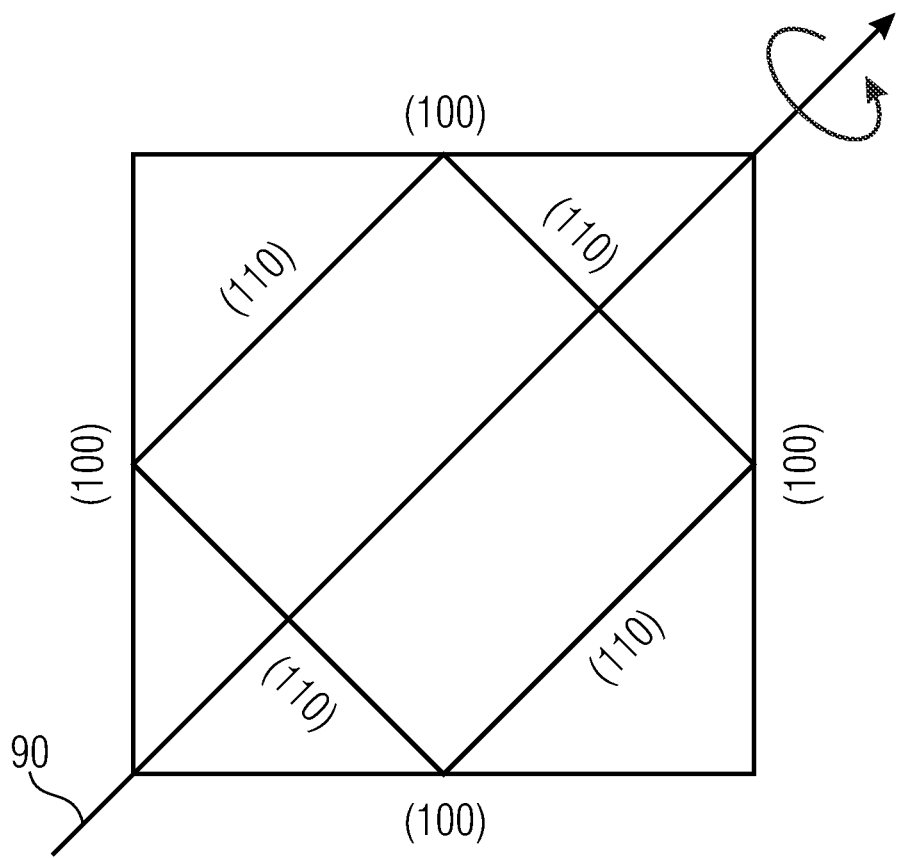
FIG. 8 shows a schematic view of a lattice structure of the semiconductor substrate.

FIG. 8 shows a schematic view of a lattice structure of the semiconductor substrate. FIG. 8 depicts a symmetry axis 90 which is placed diagonally in the (100) lattice plane. The custom-oriented semiconductor substrate 50 may be provided by rotating the lattice plane about the symmetry axis 90 by the angle α. In other words, the off-axis plane may be provided by means of rotation about the symmetry axis 90.

In the following, profile measurements (profilometer measurements) of experimentally produced etching structures 61 having different vertical and lateral extensions will be shown by means of FIG. 9. The vertical extension relates to an extension along a straight line running perpendicularly to the first main surface region 54, whereas the lateral extension relates to an extension that is parallel to the first main surface region 54. In the production of the etching structures 61, a silicon wafer 50 having a (100) lattice plane, arranged such that it is offset by 20° relative to the first main surface region 54 (a Si wafer disoriented by (100)+20°), and KOH were used for anisotropic etching.

Figure 9:
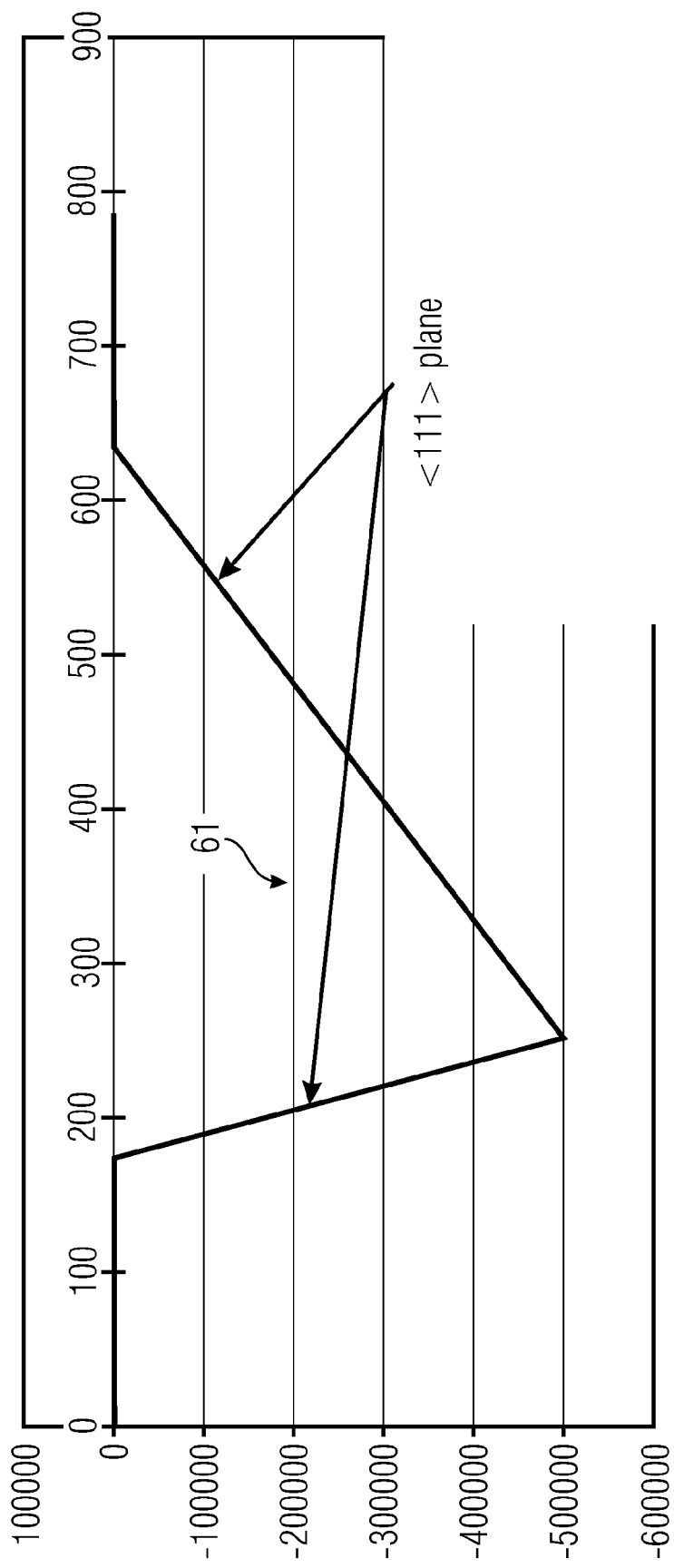
FIG. 9 shows a diagram of a cross-sectional profile of an experimentally produced etching structure 61.

In a diagram, FIG. 9 shows a profile of an experimentally produced etching structure 61 in cross-section. In this context, the ordinate describes the vertical extension of the etching structure 61 in nanometers, and the abscissa describes the horizontal extension of the etching structure in terms of the number of the equidistantly measured points (~2 μm between two adjacent points) along the first main surface region 54. The etching structure 61 here comprises different {111} planes.

The concept presented here for producing tilted windows 64 for wafer level packaging of microsystem chips is based on the principle of glass molding by means of specifically produced cavities within a silicon substrate 50.

The inventive concept differs from the known or conventional concepts by the following features. Firstly, by utilization of a custom-oriented silicon substrate 50 as a model for producing tilted windows 64. Secondly, by the fact that in an embodiment, no vacuum bonding between the glass wafer 64 and the silicon wafer 50 is required, but that the positive pressure that may be used for glass molding is provided by a vacuum chuck. Thirdly, by a combination of a custom-oriented silicon substrate and glass deposition so as to finally obtain the same structure as is obtained by molding a glass wafer 64 (glass molding) bonded to a silicon wafer 50. Fourthly, by the fact that the finally structured wafer is no structured stand-alone glass wafer but a wafer with glass windows 64 embedded in a silicon frame 50. Fifthly, by the fact that the finally structured wafer is flat, so that the glass windows 64 are not destroyed by the application of mechanical forces in the bonding process or during wafer level packaging (WLP).

Further embodiments of the present invention relate to an array of tilted windows that are embedded in a silicon frame by using glass molding by means of custom-oriented silicon substrates at the wafer level. Instead of vacuum bonding, atmospheric bonding may be used, the temperature step being performed under positive pressure relative to atmospheric pressure. Instead of glass molding, glass deposition onto custom-oriented silicon substrates may be used for producing tilted windows.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A production method comprising:
   providing a semiconductor substrate comprising a lattice plane that extends in a non-symmetrical manner and such that it is offset at an angle α from at least a first main surface region or a second main surface region of the semiconductor substrate, the first main surface region and the second main surface region extending parallel to each other;
   starting from the first main surface region, section-by-section anisotropic etching into the semiconductor substrate so as to achieve an etching structure which comprises, in a plane extending perpendicularly to the first main surface region of the semiconductor substrate, two different etching angles relative to the first main surface region;
   arranging a cover layer on the first main surface region of the semiconductor substrate, so that the cover layer is deformed to lie against the etching structure in at least some sections; and
   removing, section-by-section, the material of the semiconductor substrate starting from the second main surface region in the area of the deformed cover layer, so that the cover layer is exposed in at least one window region.

2. The production method as claimed in claim 1, wherein the lattice plane of the semiconductor substrate is the (100) lattice plane.

3. The production method as claimed in claim 1, wherein the angle α ranges from 1° to 40°.

4. The production method as claimed in claim 1, wherein providing the semiconductor substrate comprises cutting out the semiconductor substrate from a semiconductor ingot at the angle α, said semiconductor ingot comprising a (100) standard lattice orientation.

5. The production method as claimed in claim 1, further comprising:
   structured application of a mask onto the first main surface region of the semiconductor substrate, said first main surface region being exposed in an etching region, and edges of the etching region extending parallel to <110> directions of a lattice structure of the semiconductor substrate;
   said anisotropic etching being performed starting from the first main surface region into the semiconductor substrate within the etching region.

6. The production method as claimed in claim 1, wherein the two etching angles that differ relative to the first main surface region are located between the first main surface region and one {111} lattice plane of the semiconductor substrate, respectively.

7. The production method as claimed in claim 1, wherein arranging the cover layer on the first main surface region of the semiconductor substrate comprises sputter deposition or vapor deposition of the cover layer onto the first main surface region of the semiconductor substrate.

8. The production method as claimed in claim 1, wherein arranging the cover layer on the first main surface region of the semiconductor substrate comprises:
   applying the cover layer onto the first main surface region of the semiconductor substrate, so that the cover layer extends across the etching structure; and
   deforming the cover layer in the area of the etching structure, so that cover layer lies against the etching structure in at least some sections.

9. The production method as claimed in claim 8, wherein said application of the cover layer is performed under a first pressure, so that the first pressure exists between the cover layer and the etching structure; and
   wherein said deformation of the cover layer in the area of the etching structure is performed under a second pressure larger than the first pressure, and at a temperature higher than a softening point of the cover layer, so that the cover layer will deform in the area of the etching structure due to a pressure difference between the first pressure and the second pressure, so that the cover layer lies against the etching structure in at least some sections.

10. The production method as claimed in claim 8, wherein said anisotropic etching is performed starting from the first main surface region into the semiconductor substrate to the second main surface region, so that the etching structure will extend from the first main surface region to the second main surface region,
   wherein in the deformation of the cover layer in the area of the etching structure, a first pressure is provided adjacently to the cover layer, and a second pressure larger than the first pressure is provided adjacently to the second main surface region, said deformation of the cover layer in the area of the etching structure being performed at a temperature higher than a softening point of the cover layer, so that the cover layer will deform in the area of the etching structure due to a pressure difference between the first pressure and the second pressure, so that the cover layer lies against the etching structure in at least some sections.

11. The production method as claimed in claim 1, wherein said arranging of the cover layer comprises bonding.

12. The production method as claimed in claim 1, wherein the cover layer is optically transparent at least in the window region.

13. The production method as claimed in claim 1, wherein the cover layer comprises glass.

14. The production method as claimed in claim 1, further comprising:
   providing a device semiconductor substrate comprising a microscanner mirror, which in its idle position is arranged in parallel with a surface region of the device semiconductor substrate;

bonding the cover layer outside the area of the deformed cover layer onto the surface region of the device semiconductor substrate, so that the window region is arranged adjacently to the microscanner mirror.

15. A production method comprising:

providing a semiconductor substrate comprising a (100) lattice plane that extends in a non-symmetrical manner and such that it is offset at an angle a from at least a first main surface region or a second main surface region of the semiconductor substrate, the first main surface region and the second main surface region extending parallel to each other;

starting from the first main surface region, section-by-section anisotropic etching into the semiconductor substrate so as to achieve an etching structure which comprises, in a plane extending perpendicularly to the first main surface region of the semiconductor substrate, two different etching angles relative to the first main surface region;

arranging a cover layer on the first main surface region of the semiconductor substrate, so that the cover layer is deformed to lie against the etching structure in at least some sections; and removing, section-by-section, the material of the semiconductor substrate starting from the second main surface region in the area of the deformed cover layer, so that in the semiconductor substrate a window region is formed wherein the cover layer is arranged in a manner that is non-parallel to the first main surface region and wherein the cover layer is exposed.

* * * * *